United States Patent

Siemers

(10) Patent No.: US 7,161,383 B2
(45) Date of Patent: Jan. 9, 2007

(54) PROGRAMMABLE LOGIC DEVICE

(75) Inventor: Christian Siemers, Wolfsburg (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 10/532,643

(22) PCT Filed: Oct. 23, 2003

(86) PCT No.: PCT/DE03/03524

§ 371 (c)(1),
(2), (4) Date: Apr. 25, 2005

(87) PCT Pub. No.: WO2004/040766

PCT Pub. Date: May 13, 2004

(65) Prior Publication Data

US 2006/0055421 A1    Mar. 16, 2006

(30) Foreign Application Priority Data

Oct. 24, 2002 (DE) ............................... 102 49 676

(51) Int. Cl.
*H03K 19/177* (2006.01)
(52) U.S. Cl. ......................................... 326/41; 326/39
(58) Field of Classification Search ................. 326/39, 326/41
See application file for complete search history.

(56) References Cited

U.S. PATENT DOCUMENTS

| 4,870,302 | A |   | 9/1989 | Freeman |            |
|-----------|---|---|--------|---------|------------|
| 5,422,823 | A | * | 6/1995 | Agrawal et al. | 716/16 |
| 6,091,263 | A | * | 7/2000 | New et al.     | 326/40 |
| 6,255,848 | B1| * | 7/2001 | Schultz et al. | 326/41 |
| 6,346,824 | B1| * | 2/2002 | New            | 326/39 |
| 6,747,478 | B1| * | 6/2004 | Madurawe       | 326/39 |
| 2002/0143505 | A1 |   | 10/2002 | Drusinsky |     |

FOREIGN PATENT DOCUMENTS

WO        WO 00/69072        11/2000

\* cited by examiner

*Primary Examiner*—James Cho
*Assistant Examiner*—Jaosn Crawford
(74) *Attorney, Agent, or Firm*—Young & Thompson

(57) ABSTRACT

The invention relates to a programmable logic device (7) comprising several logic blocks (3A to 3D) with configurable characteristics, elements for linking the logic blocks to one another and a processing unit (4) and an input/output unit (5). In addition, the linking elements have at least one configurable changeover logic block, enabling the logic blocks (3A to 3D) to be re-configured during the operation of the logic device (7). Said changeover logic block is used for the configuration of at least one of the re-configurable logic blocks (3A to 3D) and its connection to other blocks and/or its connection to the processing unit (4) and/or to the input/output unit (5).

9 Claims, 3 Drawing Sheets

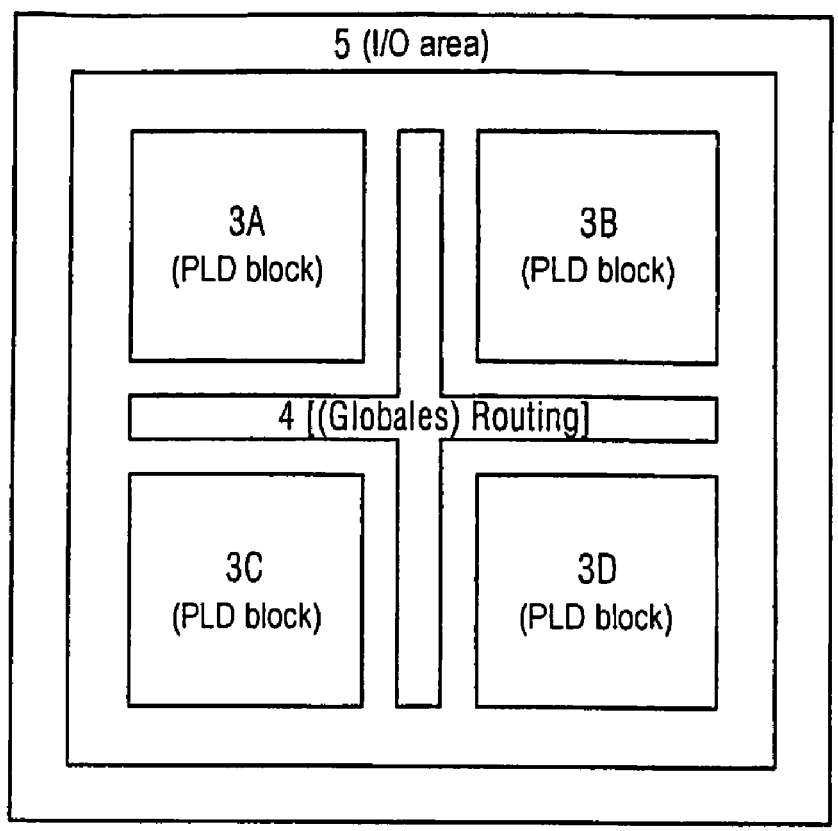
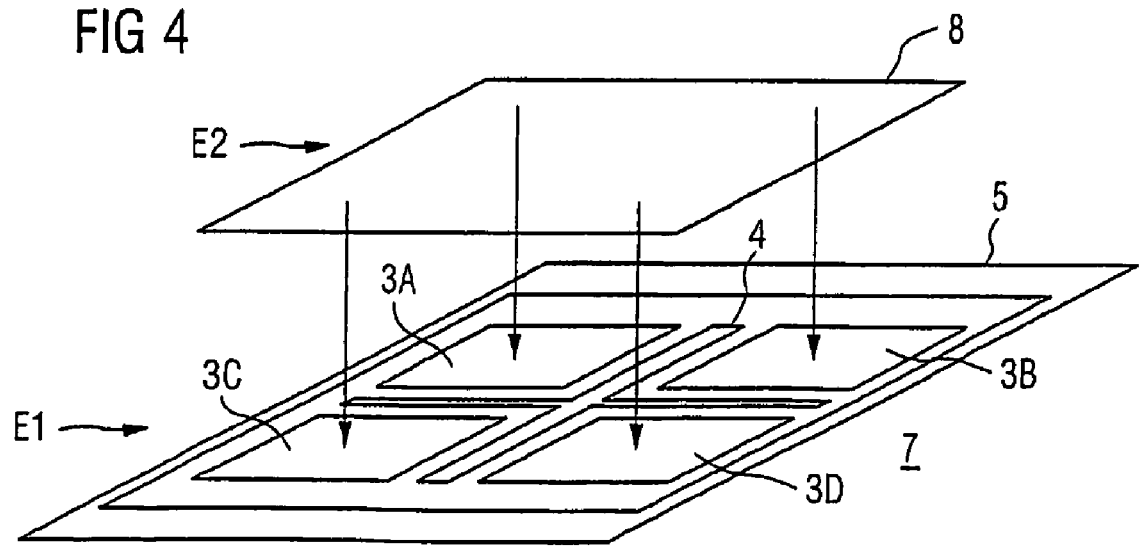

PROGRAMMABLE LOGIC DEVICE

CONTINUATION DATA

This application is a 371 of PCT/IDE03/03524 filed on Oct. 23, 2003.

CROSS REFERENCE TO RELATED APPLICATIONS

This is the 35 USC 371 national stage of international application PCT/DE2003/003524, filed on 23 Oct. 2003, which designated the United States of America.

FIELD OF THE INVENTION

The invention relates to a programmable logic device having a number of logic blocks with configurable characteristics which in each case comprise at least one logic processing unit with function programs and interfaces to the other logic blocks in each case, comprising at least one input and output unit allocated to the logic blocks and having means for linking the logic blocks to one another, to the at least one processing unit of another logic block and to the at least one input/output unit. Such a logic device can be found in U.S. Pat. No. 4,870,302 A.

BACKGROUND OF THE INVENTION

Programmable logic chips of conventional logic devices such as, in particular, processors, execute programs which are loaded from a memory. The software to be executed, in the form of instruction words, is stored there as machine instruction. These instruction words are loaded, analyzed, interpreted and executed in a processing unit. In this arrangement, the processing of a single instruction word triggers a multiplicity of individual actions in the logic device.

The basic structure and organization of known digital logic devices, particularly of computers with microprocessors, is based on the concept of the so-called "von Neumann computer". In its minimum configuration, its Central Processing Unit CPU, i.e. its computer core, comprises a main memory, a control unit and a processing unit (or arithmetic/logic unit) as main components:

The main memory stores instruction words (program data) and processing data (operant words) and provides these on request. The main memory also stores intermediate and end results of the processing. Main memories can be implemented by volatile or non-volatile memories.

The control unit organizes the order in which the instruction words are processed. It requests instruction words from the main memory and causes them to be executed in the processing unit. In addition, it analyzes the instruction words and causes processing data to be delivered to the processing unit.

The processing unit executes the operation on the processing data and supplies corresponding result words to the main memory. For each operation, the processing unit contains a microprogram which enables the transmission paths needed. The processing unit is set by the control unit to the respective type of operation, i.e. to the instruction to be processed. The central processing unit is associated with peripheral devices which can be external memories and input and output devices. The specified main components of the central processing unit can be physically separate; in most cases, however, they are implemented on a common processor chip with a cache or, for example, an embedded ROM.

Looking at the programming of such a Programmable Logic Device (PLD) with the above-mentioned basic components of the von Neumann computer in greater detail shows that the program and the initialization data are accommodated in inexpensive memories (having a minimum of 1 transistor per memory cell) and are executed into the CPU only when it is their turn. The inexpensive storage, on the one hand, and the "reuse" of the more elaborate CPU circuits such as ALU (Arithmetic Logic Unit) for all possible instructions, on the other hand, are the positive contributions to a so-called "functional density" of the processor-based computers. Naturally, the sequence of processing in time provides a negative contribution. The functional density can be defined as the mean number of active gate equivalents per silicon area and time.

In known programmable logic devices (PLDs) with computing capacity, memory and Input/Output unit I/O as found, e.g. in the US-A document initially mentioned, their structure is programmed once and the program (and data) content is stored in the structure itself. This type of storage is complex because a quantity of additional transistors must be added around the memory itself for the purpose of quick conversion into switched data paths. Although only little information is available on the utilization of the silicon, factors of 20 to 40 in the ratio of total number/visible transistor capacity (in the sense of switching function) should be assumed. In the known embodiment of a logic device, the linking of its logic blocks is firstly related to the coupling of data outputs to data inputs (routing operation) and, secondly, to the processing of the input data to the output data in the individual logic blocks (logic operation). The routing operation applies both to data which come from logic blocks (logic elements) or are conducted into these, and to those which come from I/O pads or are conducted into these. In this system of the known embodiment, only data coupling has been considered.

In U.S. Pat. No. 6,333,641 B1, a programmable logic device with an array of logic modules or blocks is found. A connecting unit with vertical routing tracks, horizontal routing tracks and local routing tracks links the logic blocks. A (universal) omnibus (data exchange bus) is placed over the array which is linked to the array in such a manner that it dynamically forms independent subarrays of the logic blocks with variable size which, in turn, are connected to the omnibus. The linking is specified from the start. This, too, is a matter of data connections, i.e. an exchange of data, as in the case of U.S. Pat. No. 4,870,302 A.

Since the programmability in the form of a memory with conversion into switched data paths is quite expensive as in the case of the computer, but the complete program has hitherto been stored in a chip, the PLDs, in spite of a potential for high functional density, "only" achieve a factor of 10 more than processors. This means that the gain in speed in PLDs compared with processor solutions comes at a high price.

SUMMARY OF THE INVENTION

It is, therefore, the object of the present invention to design the programmable logic device having the features initially mentioned in such a manner that, with a high functional density, a high speed of the PLD can be achieved by simple means.

According to the invention, this object is achieved by means of the measures specified in claim 1. These measures comprise reconfigurability of the logic blocks during the entire operation of the logic device in that the linking means additionally exhibit at least one configurable changeover logic block by means of which at least some of the reconfigurable logic blocks themselves and/or their connections to one another and/or their connections to the processing unit and/or their connections to the input/output unit are configured.

The advantages associated with such an architecture can be seen, in particular, in that with a limited number of now reconfigurable logic blocks, apart from a configuration of the blocks themselves, the connections between these blocks and/or to external chips such as memory units or microprocessors such as, e.g. to the processing unit and/or to the input/output unit are not also predetermined once and for all but that these connections can be created, i.e. configured, with the aid of additionally provided changeover logic blocks during the entire operation as required. Such configuration by means of the changeover logic block can be considered as a linking operation of the linking elements constructed according to the invention.

In this arrangement, the configuring can be performed at any time, i.e. during the entire uninterrupted period of operation—that is to say not only during a start-up or boot phase. The measures according to the invention thus mean a connection from the changeover logic block to linking areas and thus to a corresponding configuration of these. This makes it possible for different functions to be executed at different times by individual blocks; i.e. their utilization is correspondingly increased. This is associated with a corresponding improvement in performance of the entire logic device compared with a microprocessor or, respectively, no loss of performance in comparison with conventional PLDs.

Like von Neumann processors, PLDs receive two types of information, code and data. The code, which basically determines the action week and is called configuration or configuration code in PLDs, is usually loaded before the actual operation and is then unchangeable during the operation. The configuration determines, among other things, the connections which are active in the chip.

The data can change during the operation and thus also influence the current progress of the operations. Whereas, therefore, the code contains all possible paths, the actual utilization—corresponding to the path currently being passed through—is (also) determined by the data. The changeover logic block according to the invention also receives code and data. The essential feature of the invention then consists in controling the remaining non-changeover-type PLDs by changing or modifying the code.

In said prior art and in the PLDs normally used in practice, configurable blocks are connected to one another by the (run-time-variable) data being exchangeable, that is to say for instance in the form that data outputs of one block are connected to data inputs of the other one. In the case of the changeover logic block according to the invention, it is however the case that that the outputs of this logic block are at least partially connected to the code area of the configurable logic blocks which is inaccessible in operation in other embodiments. By comparison, the prior art relates to embodiments in which the configurable logic blocks are coupled in the data path but do not have any influence on the code.

Advantageous embodiments of the logic device according to the invention can be found in the dependent claims.

Thus, the changeover logic block can be preferably constructed in one plane which differs from a plane with the reconfigurable logic blocks. A different plane of the changeover logic block is understood to be every plane which is not at the same time the plane of the reconfigurable logic blocks, i.e. the plane of the changeover logic block can be located above, next to or below the plane of the reconfigurable logic blocks. At the same time, these planes can be advantageously at least largely of equivalent structure.

It is also of advantage if at least some of the reconfigurable logic blocks are configured in accordance with a predetermined context.

Furthermore, the changeover logic block can preferably exhibit at least one state memory which contains information with respect to the functions of the individual reconfigurable logic blocks so that the selected reconfigurable logic blocks are configured in accordance with the function information of the current state.

BRIEF DESCRIPTION OF THE DRAWINGS

In the text which follows, the considerations forming the basis of the measures according to the invention will be explained in further detail, referring to the drawing, in which:

FIG. 3 shows the diagrammatic structure of a partially reconfigurable PLD, and FIG. 4 shows the diagrammatic structure of a logic device according to the invention.

DETAILED DESCRIPTION OF THE INVENTION

Figure 1A:
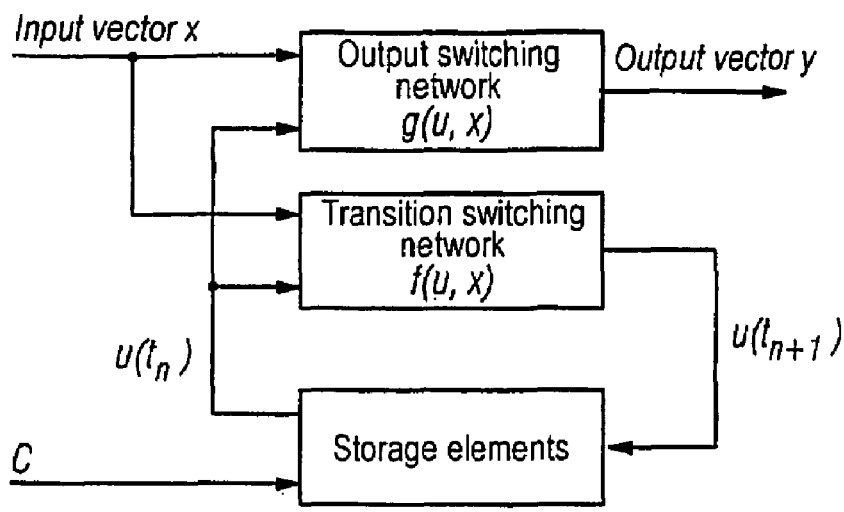
FIG. 1 shows the basic structures of four simple known types of state machines.
Figure 1B:
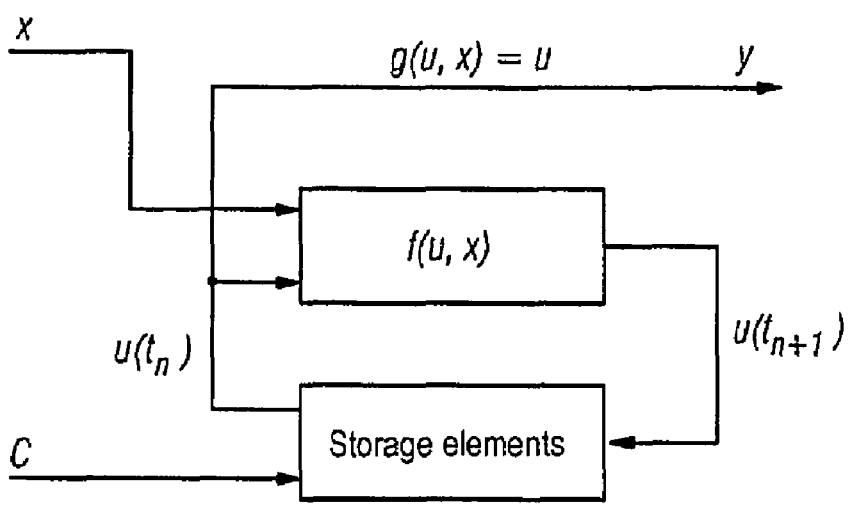
Figure 1C:
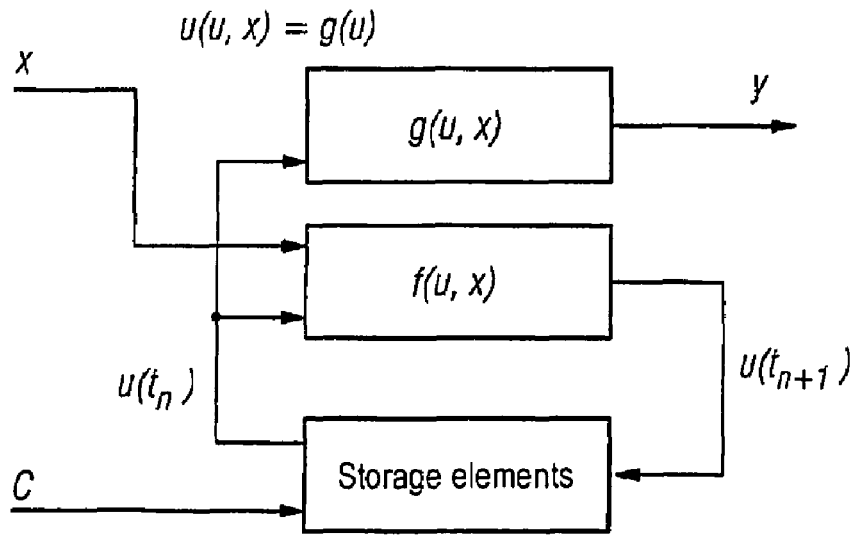
Figure 1D:
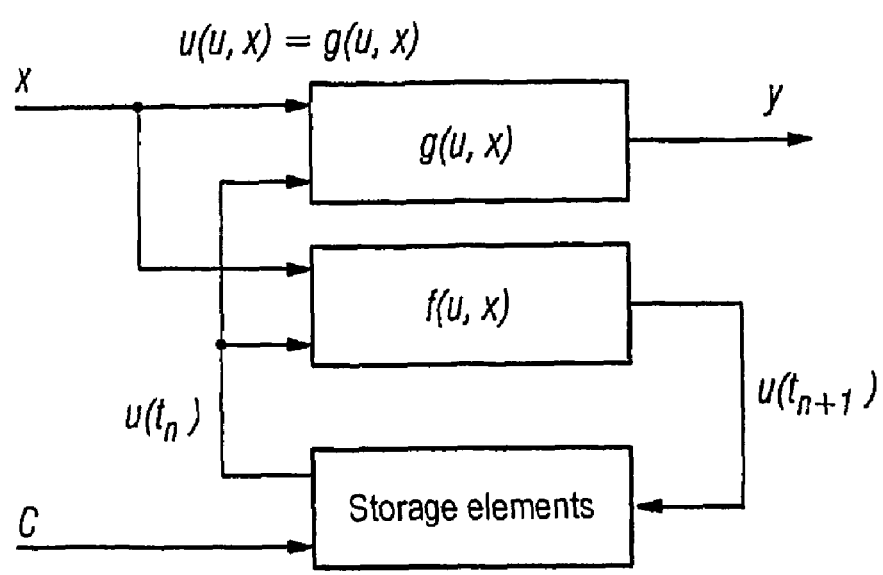

In the text which follows, the so-called "Sequential Finite State Machines" (SFSM) are derived from the machines of the so-called "finite state" type. The model shown for this purpose is suitable for defining a sequence of configurations in the PLD and it is exactly this sequence which can generate a much higher functional density (equivalent to drastically reduced costs for production and operation) of a PLD without loss of performance.

Section I ("Sequential Finite State Machines")

One of the "traditional" hypotheses for a hardware development consists in the simple finite state machines, called FSM in the text which follows.

This model, which is closely related to theoretical concepts (particularly of the so-called "deterministic finite state machine") is defined precisely as follows:

Definition 1:

An FSM consists of a 6-tuple $\{A, X, Y, f, g, a_0\}$.

$A = \{a_0, a_1, \ldots a_M\}$ is here the finite set of states, $a_0$ being the start state.

$X = \{X_1, \ldots X_K\}$ is the finite set of input vectors with $X_j = (x_1, \ldots x_L)_j$, where $x_1 \in \{0, 1, -\}$.

$Y = \{Y_1, \ldots X_N\}$ is the finite set of output vectors with $Y_j = (y_1, \ldots y_H)_j$, where $y_h \in \{0, 1, -\}$.

f: $A \times X \rightarrow A$ means transition function (Next State Decoder), g: $A \times X \rightarrow Y$ means output function (Output Decoder), t = unit of time.

The functions mentioned in this definition are implemented by switching networks which represent the algorithmic relation between the (essentially binary) input and state vectors. However, this requires that the states are also coded in binary, which was not yet the case in definition 1.

For the state machines, three essential subtypes (see FIG. 1) are also distinguished, the influence on the complexity of the functions of which is given in practice. A developer will perform the following steps:

1. Defining the signals: The sequential circuit is outlined as "black box" having the required input and output signals.
2. Designing the state diagram: This step is the actual core of the synthesis since the problem to be solved is formally described here. Possible state diagrams are state graphs, program flow charts or also sequential circuit tables.
3. Setting up the sequential circuit table as a formal starting point for all other operations.
4. State minimization: Minimizing the number of states is intended to result in a simplification of the design.
5. State coding: In the case of synchronous sequential circuits with synchronized inputs (not for a Mealy state machine according to FIG. 1$d$), arbitrary codings can be specified for the states from Z. In the case of the Medwedjew state machine according to FIG. 1$b$, however, the codings must correspond to the desired output signals; in the case of the Moore state machine according to FIG. 1$c$, in contrast, the codings can be selected in such a manner that simplified switching networks are obtained for next state decoder (f) and output coder (g).
6. Calculation of successor state and output switching networks: For the actual calculation of the successor state switching network, a type of register or flipflop must be selected since its inputs (T, D, RS or JK) are occupied by this switching network but indicate different functionalities.
7. Implementation of the switching network and test In the "Journal of Systems Architecture", vol. 47, 2002, pages 1043 to 1064, the fundamental operation of reconfigurable models of FSMs and their implementation in FPGAs (Field Programmable Gate Arrays) as special PLDs is described. The design methods are considered in order to code applications for reconfigurable chips. The hardware used for this purpose, and thus the architecture of the chips, follow the state of the art; i.e. known architectures are used as a basis. However, no actual technical embodiments are demonstrated.

It is known from practice that an implementation as simple state machine—which could also be called a "flat machine"—is not necessarily the best one. A cooperating state machine consisting of a number of simple state machines which are coupled to one another can do this frequently much better in a sense of better area efficiency. In addition, it should be considered that the design flow outlined above does not necessarily have to be carried out in the manner specified. It is recognizable that a more algorithmic style is being used especially with an increase in descriptions in high-level languages such as VHDL.

Independently of this, however, the FSM is to be assumed as the basic model. It can be imagined that there is not only one FSM but a number of these, exactly one of these being active at one time. A marked part (the so-called "sequencer") then switches between the individual FSMs in dependence on input signals or results achieved.

In the text-which follows, the sequential finite state machine (SFSM) is correctly defined and represented on the basis of this FSM:

Definition 2:
A Sequential Finite-State Machine (SFSM) consists of a 5-tuple (B, $B_0$, C, V, h), where $B=\{B_0, \ldots B_K\}$ is a finite set of Finite State Machines (FSM), $B_0$ is the start FSM, $C=\{C_0, \ldots C_K\}$ describes a finite set-of states for identifying the current FSM, $V=\{V_1, \ldots V_N\}$ is the finite set of (additional) input vectors with $V_i=(v_1, \ldots v_L)_i$, where $v_1 \in \{0, 1, -\}$, h: B×V→B is FSM transition function (next FSM decoder).

The essential advantage of this SFSM (see also FIG. 2 in this regard) lies firstly in the modeling. A designer has the chance of dividing his design into relatively small portions. In the technical construction, it will then be attempted to map the (still finite) set of states from all FSMs $B_k$ onto a uniform state coding. In addition, a coding for the $C_k$ of the current FSM $B_k$ must also be carried out in order to enable the next FSM to be calculated for the function h.

Figure 2:
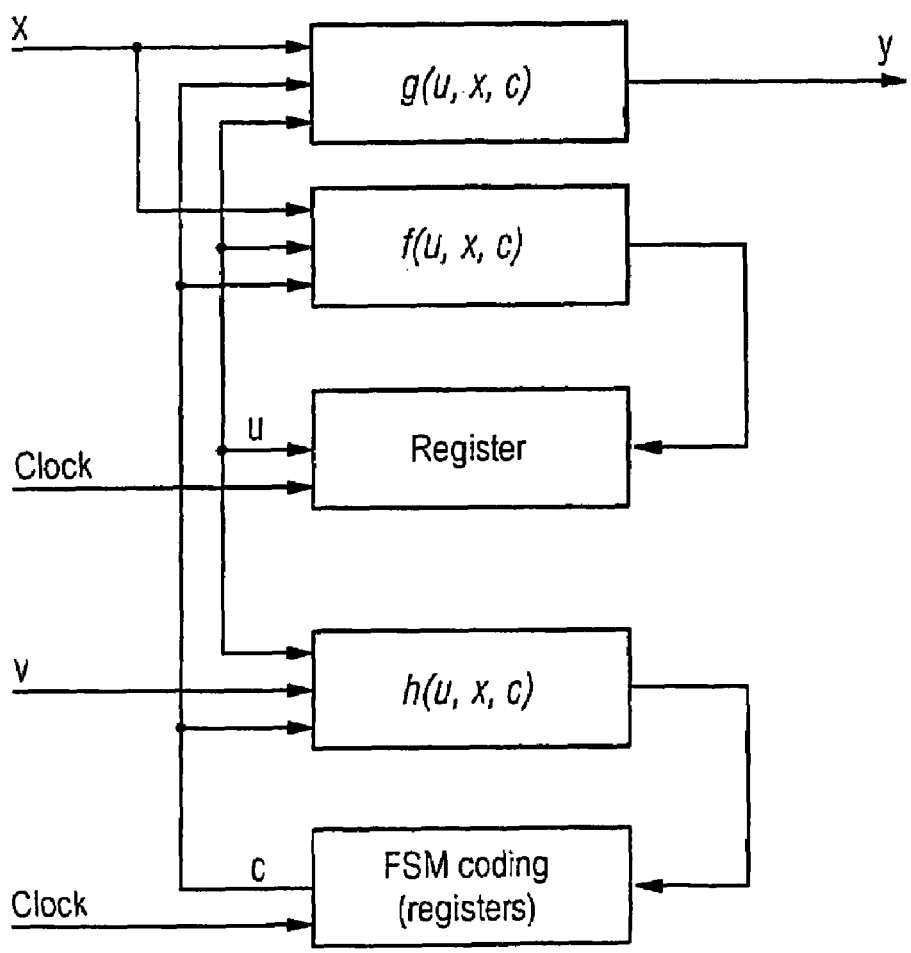
FIG. 2 shows the basic structure of a so-called "sequential finite state machine"

On the other hand, a glance at FIG. 2 shows that actually only very little is gained. If the timing is identical for all registers, the registers and the switching network f (u*, x*) (Next State Decoder), where * means total set, were divided into subsets of registers with f(u, x, c) and h(u, v, c) which are combined again in the implementation. This scarcely reduces the size of the solution because in a PLD of current construction, all parts, that is to say all part-FSMs, must be integrated on the chip. This is where the considerations according to the invention apply. It is true that there are a few FPGAs (Field-Programmable Gate Arrays; compare, e.g., "Spectrum der Wissenschaft", August 1997, pages 44 to 49) which are dynamically reconfigurable, but this is only partial. This reconfigurable characteristic could be utilized by loading and executing the registers for FSM coding in a permanent part h(u, v, c) and the current FSM in the reloadable part. The problem is the loss in performance on reloading. This can be seen from the example below:

EXAMPLE

The road traffic light, which is a favorite example of a Finite State Machine, can also provide a very good example of a sequential FSM if a night mode is considered. The word mode indicates the approach: the switching between individual FSMs should include something like a mode change, and day and night mode are mutually exclusive.

FSM1 then integrates the day light, FSM2 integrates the night light (e.g. amber flashing for the side roads) and in the higher-level sequencer a timing signal is used for deciding which FSM will be executed and which is idle. The sequencer is implemented as FSM0.

The three FSMs (0 . . . 2) required for this are described separately but then integrated on one PLD so that FMS0 would be in area 0, FSM1 in 1 and FSM2 in 2. This would not result in a gain in area.

In the reloadable case, FSM0 would have to be available permanently, and also an area which could accommodate the maximum of {FSM1, FSM2}. In this area, one of two would then be continuously loaded and changing over would entail a reconfiguration. To illustrate the advantage in the case of dynamically reconfigurable PLD as are represented by logic devices according to the invention, the transition function f(u, x, c) (compare FIG. 2) is now designated as $f_c(u, x)$ (this equivalently applies to function g). This representation is intended to demonstrate the difference in dependence: u and x effect a continuous timing-associated development of the state of the machine whereas c describes the dependence on the much rarer mode change.

The reconfiguration itself would occupy a comparatively large amount of time; it has been recognized that a much more-advantageous solution consists in an extended architecture of PLDs in which a number of programs are stored at the same time in a dynamically switchable manner. A corresponding logic device could be called a multi-plane PLD; however, in order to take into account the aspect of the respective "context" and to show that only part-areas are affected by change-over processes, the name of dynamical multi-context PLDs (dMC-PLDs) is chosen here.

Section II (Architecture of Dynamical Multi-Context PLDs According to the Invention)

Firstly, a problem will be addressed that applies both to traditional dynamically reconfigurable PLDs and to dMC-PLDs. If only one part-area is switched over, its interfaces must remain constant towards the outside, particularly in the direction of the remaining parts. At the same time, some function programs (so-called routing resources) are also affected by the change-over since the block to be changed over must contain not only logic but also connections.

In consequence, in the text which follows, a PLD block will be defined for the logic device according to the invention as a reconfigurable unit consisting of logic processing units with routing resources and interfaces (so-called routing) to other blocks; this definition corresponds to the partially reconfigurable chips normally used in practice. The definition of this block deviates from the usual definition of the logic blocks.

Considering a fictitious PLD with such blocks, an architecture is obtained such as is shown in FIG. 3. In the FIG. 2 designates a partially reconfigurable PLD device or structure, 3A to 3D designates four PLD blocks (=logic blocks), 4 designates (global) routing which forms a processing unit with function programs and interfaces to the blocks, and 5 designates an I/O area which represents means for linking the logic blocks to the processing unit and to an input/output unit. This architecture can also be imagined in such a manner that—leaving out of consideration the I/O resources 5 at the outer edge—each PLD block 3A to 3D corresponds to a full CPLD (complex PLD) or FPGA. Such architectures are already in existence, e.g. "Cypress Delta39k", "Lattice-Vantis Godfather" architecture; but they are not reconfigurable in the operating state of the PLD device.

In the dMC-PLD architecture of a logic device 7 according to the invention, indicated diagrammatically in FIG. 4, an additional PLD is superimposed on the PLD structure 2 according to FIG. 3. This extra PLD designated as changeover logic block 8 does not exist in known logic devices and is intended to handle the changeover function h(u, v, c) (compare FIG. 2). In consequence, it represents a part of linking elements by means of which at least some of the logic blocks 3A to 3D are configured between one another and/or with the processing unit 4 and/or the input/output unit 5. This means that the outputs in FIG. 4 correspond to a stored context c and control the selection of the current functions $f_c(u, x)$ and $g_c(u, x)$. Thus, a structure is obtained for this extra PLD which calculates a few, exclusively stored outputs from many inputs (u, x).

This extra PLD forms the configurable changeover logic block according to the invention. It must necessarily have access to the configuration section of the other logic blocks operating normally since it would otherwise not be possible to effect a reconfiguration. For this reason, the outputs of the logic changeover block must be connected at least partially to the code area of the (other) logic blocks to be configured so that these can be configured or it is possible to switch between their configurations. Such a "changeover" connection does not exist in known constructions and other non-changeover logic blocks do not have such connections either.

The advantages resulting from this structure can be seen in that the functional density, and thus the usability, are enhanced and the costs per application can be lowered. The following rough estimate can be provided for this:

Let us assume that the utilization of transistors used is 1:20; i.e. of 20 transistors used, in fact only one can be seen in the (programmable) logic function. For the extra PLD 8, 20% overhead can be estimated since this is a logic block which does not contribute anything to the actual functionality but only switches the other blocks 3A to 3D. For storage and decoding of the additional programs (only 4 stored functions are assumed per PLD block), a further 6 transistors are calculated (4 transistors for storage and 2 for selecting 1 of 4). This results in a new utilization of 4:30, which is at least an increase in density compared with known embodiments by 166%.

A problem could possibly occur due to the fact that, due to a number of configurations from which a current one is to be selected, the critical path within a PLD block can increase by one transistor which would be accompanied by a decrease in the maximum clock rate. For this purpose, a distinction must be made between so-called SRAM-based storage, on the one hand, and so-called FLASH EEPROM or anti-fuse, on the other hand.

For SRAM-based methods, a method is proposed in U.S. Pat. No. 6,011,740 A, to implement the storage of a number of configurations in a shadow RAM, e.g. as a circular buffer, and to load the information currently needed into a main memory cell. This method guarantees a maximum operating speed.

For flash and anti-fuse storage, a reloadable SRAM cell could also be considered as the actual cell so that the abovementioned solution is applicable; however, this means additional expenditure and possibly a reduction in speed due to the change in technology in the storage. In these technologies, a further path transistor which decodes the current context is actually introduced in the path, possibly in the form of dual-gate FETS.

The exact allocation which block size and extra PLD size are of advantage for the multiplicity of applications can be determined from examples in simulations.

An implementation of the logic device according to the invention according to FIG. 4 can be imagined to be such that the two layers diagrammatically shown, namely that with the extra PLD 8 ("changeover logic block") and that with logic blocks 3A to 3D, are in each case in one plane E2 and E1, respectively, and are preferably at least largely equivalent and do not only switch one another but also generate the programming of the other part in each case. Changeover means in this case that a selection is made between predetermined programs. Mutual programming, in contrast, can be used for adaptation (evolution) to the respective environment. A simple example can be a digital PLL which adapts a frequency to a master clock by means of delay effects.

According to a corresponding actual exemplary embodiment, a traffic light system will be selected which has two modes, namely a day mode and a night mode. Each of these modes is designed as one FSM; normal implementation is then that both are also really implemented on the PLD and thus need approximately twice the space.

The implementation in a reconfigurable architecture according to the invention then provides that both modes are implemented in the same part, in such a manner that one is active (e.g. day mode), whereas the other one (then: night mode) is only inactive in the memory. The changeover logic block then detects the changeover conditions such as time and/or darkness and/or traffic volume and/or any other external signal and, in dependence on this, initiates a changeover between the modes, e.g. by reloading the memory content. For this purpose, the changeover logic block must have access to the respective configuration memory of the other blocks.

The invention claimed is:

1. A programmable logic device comprising:
   a number of logic blocks with configurable characteristics which in each case comprise at least one processing unit with function programs and interfaces to the in each case other logic blocks,
   at least one input/output unit associated with the logic blocks, and
   means for linking the logic blocks
   a) to one another,
   b) to at least one of the processing units of another logic block and
   c) to the at least one input/output unit,
   characterized by reconfigurability of the logic blocks (3A to 3D) during the entire operation of the logic device (7), due to the fact that the linking elements additionally exhibit at least one configurable changeover logic block (8) by means of which at least some of the reconfigurable logic blocks (3A to 3D) themselves and/or their connections to one another and/or their connections to the at least one processing unit (4) and/or their connections of the at least one input/output unit (5) are configured,
   wherein the changeover logic block (8) is constructed in a first plane (E2) which differs from a second, non-coplanar plane (E1) with the reconfigurable logic blocks (3A to 3D), and
   wherein the first and second planes (E1, E2) are constructed at least largely equivalently.

2. The device as claimed in claim 1, characterized in that at least some of the reconfigurable logic blocks (3A to 3D) are configured in accordance with a predetermined context (c).

3. The device as claimed in claim 1, characterized in that the changeover logic block (8) exhibits at least one state memory which contains information with respect to the functions of the individual reconfigurable logic blocks (3A to 3D), and that the selected reconfigurable logic blocks are configured in accordance with the function information of the selected state.

4. The device of claim 1, wherein the first plane is located above the second plane.

5. The device of claim 1, wherein the first plane is located below the second plane.

6. A programmable logic device comprising:
   plural logic blocks (3A, 3B, 3C, 3D) with configurable characteristics, the plural logic blocks being located within a first plane,
   a processing unit (4) with function programs and interfaces to each of the logic blocks;
   an input/output unit associated with the logic blocks; and
   a linking part linking the logic blocks a) to one another, b) to at least one of the processing units of another logic block, and c) to the input/output unit, wherein,
   the linking parts comprise a configurable changeover logic block (8) connected to the logic blocks and operative to reconfigure, during operation of the logic device, the connections of the logic blocks (3A to 3D) to another logic block and to the processing unit (4), the changeover logic block being located within a second plane and being located outside the first plane, and
   the first plane and the second plane are constructed at least largely equivalent.

7. The device of claim 6, wherein the first plane is located above the second plane.

8. The device of claim 6, wherein the first plane is located below the second plane.

9. The device of claim 6, wherein the processing unit (4) is located within the first plane and is located between each of the logic blocks.

* * * * *